(12) United States Patent
Hayashi (10) Patent No.: US 6,917,071 B2
(45) Date of Patent: Jul. 12, 2005

(54) SEMICONDUCTOR DEVICE, NONVOLATILE SEMICONDUCTOR STORAGE APPARATUS USING THE DEVICE, AND MANUFACTURE METHOD OF THE DEVICE

(75) Inventor: Fumihiko Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/347,397

(22) Filed: Jan. 21, 2003

(65) Prior Publication Data

US 2003/0141538 A1 Jul. 31, 2003

Related U.S. Application Data

(63) Continuation of application No. 09/732,706, filed on Dec. 11, 2000, now abandoned.

(30) Foreign Application Priority Data

Dec. 10, 1999 (JP) ............................................. 11-352358

(51) Int. Cl.$^7$ ............................................. H01L 29/788
(52) U.S. Cl. ...................... 257/316; 257/317; 257/319; 257/320; 257/321; 257/322
(58) Field of Search ................................ 257/315–317, 257/319–322

(56) References Cited

U.S. PATENT DOCUMENTS 5,514,607 A * 5/1996 Taneda ........................ 438/259

5,793,079 A * 8/1998 Georgescu et al. ......... 257/316

FOREIGN PATENT DOCUMENTS

| JP | S62-205665 A | 9/1987 |
|----|--------------|--------|
| JP | S63-142869 A | 6/1988 |
| JP | H05-243530 A | 9/1993 |
| JP | 7-147389 | 6/1995 |
| JP | H08-36890 A | 2/1996 |
| JP | H08-107158 A | 4/1996 |
| JP | H11-233652 A | 8/1999 |
| JP | H11-261039 A | 9/1999 |
| JP | H11-274438 A | 10/1999 |

* cited by examiner

Primary Examiner—Thien F Tran
(74) Attorney, Agent, or Firm—Sughrue Mion, PLLC

(57) ABSTRACT

There are provided a semiconductor device which is operable with a small occupied area, high reliability, and low power consumption, a nonvolatile semiconductor storage apparatus using the device and a manufacture method of the device. A semiconductor device of the present invention comprises a first gate insulating film, floating gate, second gate insulating film, and control gate on a semiconductor substrate, and a source area and a drain area formed in the semiconductor substrate on opposite sides of the floating gate, the floating gate comprises a first floating gate and a second floating gate disposed to cover the first floating gate, and an isolating gate is formed on the second floating gate on the side of the semiconductor substrate, and parallel to the first floating gate via an isolating insulating film 26.

14 Claims, 9 Drawing Sheets

SEMICONDUCTOR DEVICE, NONVOLATILE SEMICONDUCTOR STORAGE APPARATUS USING THE DEVICE, AND MANUFACTURE METHOD OF THE DEVICE

This is a continuation of application Ser. No. 09/732,706 filed Dec. 11, 2000; now abandoned the disclosure of which is incorporated herein by reference.

BACKGROUND OF THE INVENTION

1. Field of the Invention

The present invention relates to a semiconductor device, a nonvolatile semiconductor storage apparatus using the device and a manufacture method of the device, particularly but not limited to a preferable semiconductor device for use in an electrically erasable and programmable read only memory (EEPROM), and the like, a nonvolatile semiconductor storage apparatus using the device and a manufacture method of the device.

2. Description of the Related Art

One type of a conventional nonvolatile semiconductor memory (which is mainly ROM) are various EEPROMs. In such a memory frequently perform data writing, erasing, reading, and the like are performed electrically, and rewritten data is held for a very long time.

In the EEPROM, a cell structure is of a two-layer gate type in which, for example, a floating gate is formed on a transistor channel area via a first gate insulating film, and a control gate is formed on the floating gate via a second insulating film. By thinning a part of the first gate insulating film to such an extent that a tunnel effect occurs, electron injection into and discharge from the floating gate by the tunnel effect is used for information writing and erasing.

Figure 1:
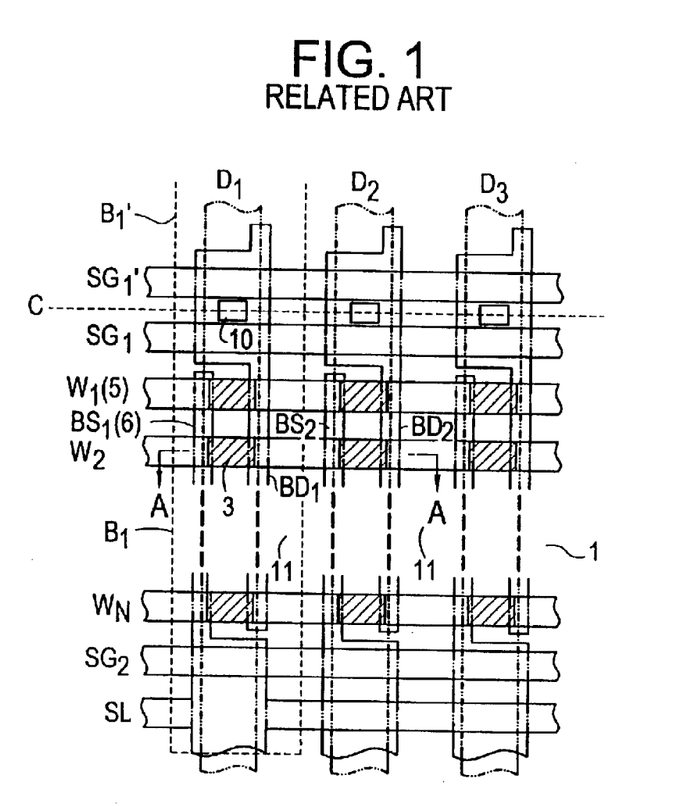
FIG. 1 illustrates a plan view showing one example of the memory array of a conventional EEPROM.
Figure 2:
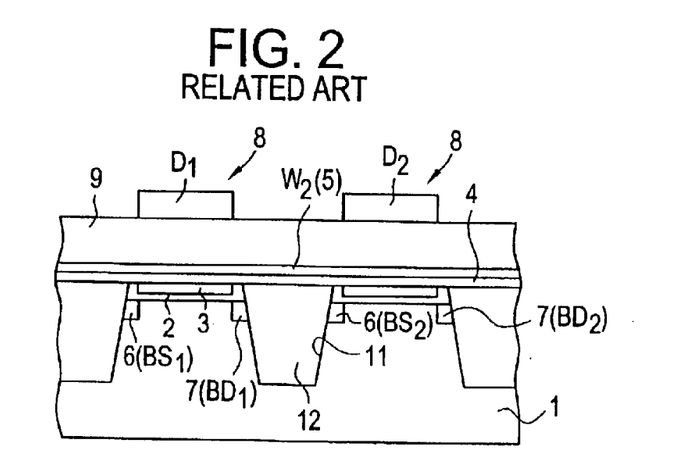
FIG. 2 illustrates a sectional view along line A—A of FIG. 1.
Figure 3:
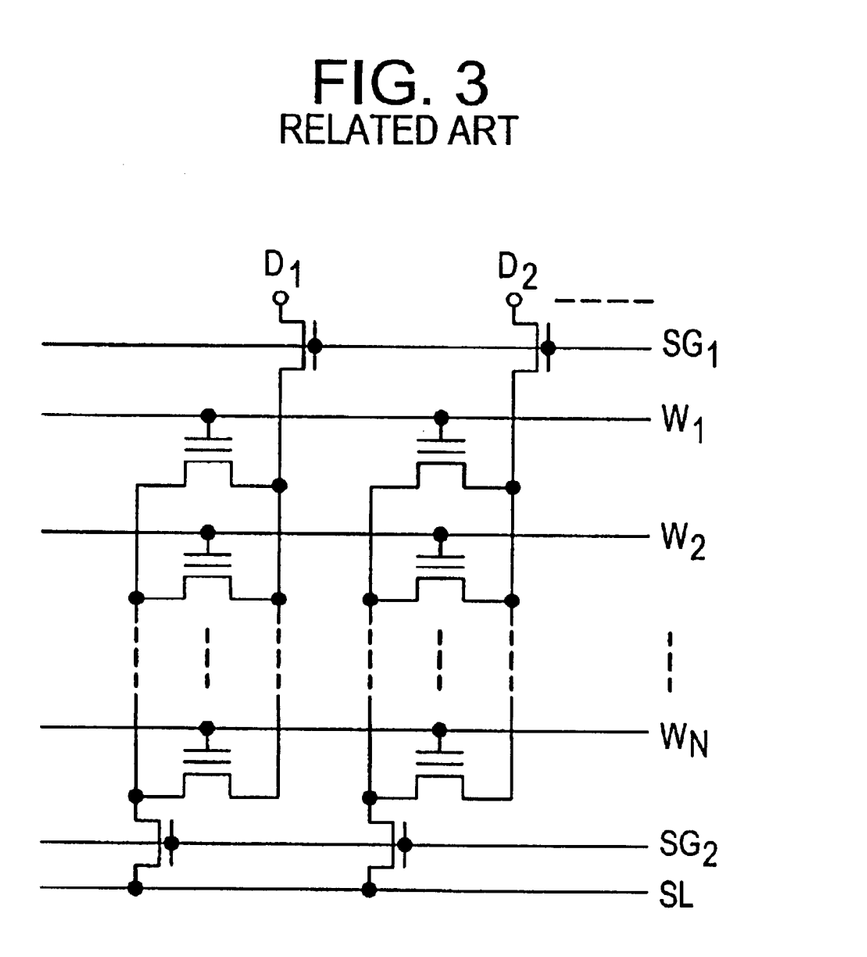
FIG. 3 illustrates an equivalent circuit diagram of the memory array of the conventional EEPROM.

FIG. 1 is a plan view showing one example of a memory array of an EEPROM. This EEPROM is disclosed, in Japanese Patent Application Laid-Open No. 147389/1995. FIG. 2 is a sectional view along line A—A of FIG. 1, and FIG. 3 is an equivalent circuit diagram of the memory array of FIG. 1.

This memory array is referred to as an AND type. The main surface of a memory array area in a p-type semiconductor substrate 1 is provided with a buried bit line BD ($BD_1$, $BD_2$, . . . ) consisting of an $n^+$-type semiconductor area and a buried source line BS ($BS_1$, $BS_2$, . . . ), and these buried bit lines $BD_1$, $BD_2$, . . . and buried source lines $BS_1$, $BS_2$, . . . extend parallel to each other along one direction of the memory array and are alternately arranged in the array direction.

A word line W ($W_1$, $W_2$ . . . ) is disposed in a direction crossing at right angles to the buried bit lines BD and buried source lines BS, and a memory cell for storing one bit of information is formed in an area in which the word line W, and a buried bit line BD or a buried source line BS intersect one another.

A block $B_1$ is an area between a select gate $SG_1$ and a common source line SL. A block $B_1'$ is formed similar to the block $B_1$. These blocks are symmetric with respect to the line C in FIG. 1. Select transistors include select gates $SG_1$ and $SG_1'$ respectively and each block is selected according to voltages applied to each select gate.

A memory cell of this memory is constituted of an floating gate transistor 8 comprising a first gate insulating film 2; a floating gate 3; a second gate insulating film 4; a control gate 5 formed integrally with the word line W; a source area 6 integrated with the buried source line BS formed inside the p-type semiconductor substrate 1 and on both sides of the floating gate 5; and a drain area 7 integrated with the buried bit line BD.

An interlayer insulating film 9 is formed on the control gate 5, and a bit line D ($D_1$, $D_2$, . . . ) is connected to a buried bit line BD ($BD_1$, $BD_2$, . . . ) via a contact hole 10 formed in the interlayer insulating film 9. Moreover, end portions of the buried source lines BS ($BS_1$, $BS_2$, . . . ) are connected to the common source line SL. The common source line SL consists of an n+-type semiconductor area on the main surface of the p-type semiconductor substrate 1. Furthermore, in the main surface of the semiconductor substrate 1, a groove 11 for isolating memory cells connected to the same word line W is formed, and an insulating film 12 is buried in the groove 11.

When a data is written to the memory cell, and for example, when the cell connected to a bit line $D_1$ is a writing cell, and a cell connected to a bit line $D_2$ is a non-writing cell, a voltage of 5 V is applied to the drain area 7 (the buried bit line $BD_1$) of the writing cell, the source area 6 (the buried source line $BS_1$) is grounded (0 V), a high voltage of 10 V is applied to the word line $W_2$ (the control gate 5), and a channel hot electron generated in the drain area 7 (the buried bit line $BD_1$) is injected to the floating gate 3. Therefore, the data is written to the memory cell formed in an area in which the word line $W_2$ and the bit line $D_1$ intersect one another.

Moreover, in order to erase the data written to the writing cell, a negative voltage of −10 V is applied to the word line $W_2$ (control gate 5), the drain area 7 (the buried bit line $BD_1$) is grounded (0 V), a voltage of 5 V is applied to the source area 6 (the buried source line $BS_1$), and an electron is drawn toward the source area 6 (the buried source line $BS_1$) from the floating gate 3 by Fowler-Nordheim (FN) tunneling. Therefore, the data is erased from the memory cell formed in an area in which the word line $W_2$ and the bit line $D_1$ intersect one another.

In the aforementioned conventional memory cell, since source and drain are separated from those of an adjacent cell, incorrect writing to the adjacent cell can be prevented. However, it is very difficult to establish both high integration and low power consumption as described later.

In the conventional memory cell, a writing system by channel hot electron (CHE) injection is used. In this system of passing a current to a channel, and injecting a hot electron generated in the drain area 7 (the buried bit line $BD_1$) to the floating gate 3 by a gate electric field applied to the control gate 5 (the word line $W_2$), injection efficiency is remarkably small, as about $10^{-7}$, and a large current of several hundreds of microamperes to several milliamperes is consumed during writing to one cell. Therefore, a burden to the charge pumping circuit is large, and the number of cells to be written at the same time is limited, or a chip size is enlarged since capacitors of the charge pumping circuit must be large.

As a countermeasure, a writing system using FN tunneling in a channel area is proposed.

This is a system of applying the high voltage to the control gate 5 (the word line $W_2$), generating an electric field of 10 to 11 MeV in the first gate insulating film 2, and injecting the electron to the floating gate 3 by FN tunneling. Writing is possible with a small current of several tens to several hundreds of pA per cell, the burden to the charge pumping circuit is small because of a low power consumption, the number of cells to be written at one time can be increased, and capacitors of the charge pumping circuit can be little, so chip size increase can be depressed.

When the writing is performed using the channel FN tunneling, a high voltage of about 19 V is applied to the control gate 5 (the word line W.), and 0 V is applied to the bit line (the buried bit line $BD_1$) of the writing cell. In this case, since the high voltage is uniformly applied to the control gate 5 of the cell connected to one word line, a writing inhibition voltage of about 5 V is applied to the bit line (the buried bit lines $BD_2$, $BD_3$, . . . ) of the non-writing cell to inhibit FN tunneling in the non-writing cell.

In this case, when the drain or the source fails to be separated from the adjacent cell, a bit line potential of 0 V for writing exerts an influence on the adjacent cell (for example, the memory cell formed in an area in which the word line $W_2$ and the bit line $D_2$ intersect one another), and writing is inadvertently performed. Alternatively, another phenomenon disadvantageously occurs in which the writing inhibition voltage also exerts an influence on the adjacent cell and the writing is not performed.

Therefore, when channel FN tunneling writing for realizing the low power consumption is used in the conventional memory cell, it is essential to separate the source and drain of the cell from the source and drain of the adjacent cell, for example, by the isolating groove 11 or the like. However, since the isolation structure itself is large, memory cell size is increased, and it is disadvantageously difficult to raise an integration degree.

Moreover, in the conventional memory cell, because of the presence of the isolation structure, in order to raise the integration degree, the floating gate 3 and the control gate 5 have to be miniaturized. As a result, a large coupling capacity ratio $R_c$ cannot be secured, and it is disadvantageously difficult to realize a low voltage. The coupling capacity ratio $R_c$ is shown below, where a capacity of a tunnel film is C1 and a capacity between the floating gate and the control gate is $C_2$.

$$R_c = C_2 (C_1 + C_2)$$

The present invention has been developed in consideration of the aforementioned circumstances, and an object thereof is to provide a semiconductor device, a nonvolatile semiconductor storage apparatus using the device and a manufacture method of the device, in which the occupied area of the semiconductor device can be reduced, operation is possible with low power consumption, and low voltage can be realized.

SUMMARY OF THE INVENTION

In an embodiment of the semiconductor device of the present invention, with a two-layer structure comprising a first floating gate and the second floating gate disposed to cover the first floating gate, a capacity ratio is enlarged, and a low voltage can be realized.

Moreover, by forming an isolating gate parallel to the first floating gate with an isolating insulating film therebetween, an element isolation function during application of the high voltage is secured, leak current or the like fails to easily occur, and as a result, incorrect operation is eliminated and reliability is enhanced.

There can thus be provided a semiconductor device with a small occupied area, low power consumption and high reliability.

In the semiconductor device of the present invention, by forming at least the portion of the first gate insulating film corresponding to the first floating gate as the tunnel film, data writing can be performed by channel Fowler-Nordheim (FN) electron injection, and data erasing can be performed by channel Fowler-Nordheim (EN) electron extraction Moreover, since a sufficient pressure resistance of the insulating film can sufficiently be obtained on the source area and drain area, reliability during application of the high voltage is enhanced.

In the semiconductor device of the present invention, by setting the insulating layer between the first floating gate and the isolating gate to be thicker than the tunnel film, even during the channel Fowler-Nordheim (FN) electron injection/extraction, there is no possibility that the electron passes through the insulating layer by the tunnel effect, and an insulating property between the first floating gate and the isolating gate is enhanced.

In the nonvolatile semiconductor storage apparatus of the present invention, by disposing the semiconductor device described above in the respective intersections of the plurality of buried bit lines and word lines, the channel Fowler-Nordheim (FN) electron injection/extraction can be performed, the low power consumption, parallel writing and high reliability can be secured, and the device is preferable particularly during large capacity serial access.

There can thus be provided the nonvolatile semiconductor storage apparatus with the small occupied area, low power consumption, and high reliability.

The nonvolatile semiconductor storage apparatus of the present invention shares the buried bit line with the adjacent semiconductor device, and controls the isolating gate by a control means. When the isolating gate is turned off by the control means during data writing, a writing inhibition voltage can be applied for each bit of one word.

For another nonvolatile semiconductor storage apparatus of the present invention, in the nonvolatile semiconductor storage apparatus described above, the buried bit line is separated into an odd-lumbered buried bit line and an even-numbered buried bit line, and a desired isolating gate is selected by the odd-numbered buried bit line or the even-numbered buried bit line.

For another nonvolatile semiconductor storage apparatus of the present invention, the nonvolatile semiconductor storage apparatus described above further comprises selecting means for dividing the plurality of buried bit lines into a plurality of sub-bit lines to select the sub-bit lines.

A manufacture method of a semiconductor device of the present invention comprises: an isolating gate forming step of successively forming a first gate insulating film, isolating gate film and first insulating film on a semiconductor substrate, subsequently selecting/removing the isolating gate film and first insulating film, and forming an isolating gate and isolating insulating film; an insulating film forming step of forming an insulating layer on opposite side portions of the isolating gate and isolating insulating film; a first floating gate forming step of forming a first floating gate on one side portion of the insulating layer; and a second floating gate forming step of forming a second floating gate to cover the first floating gate and isolating insulating film.

A silicon oxide film as the first gate insulating film, and a silicon nitride film as the first insulating film are preferable.

In the manufacture method of the semiconductor device, by using a conventional manufacture apparatus as it is, and only slightly clanging a manufacture process, the semiconductor device can easily be manufactured in which the isolating gate is formed on the second floating gate on the side of the semiconductor substrate, and parallel to the first floating gate via the isolating insulating film.

For another manufacture method of the semiconductor device of the present invention, the manufacture method of the semiconductor device described above further comprises, after the first floating gate forming step: an interlayer insulating film forming step of forming an interlayer insulating film on the isolating insulating film, insulating layer and first floating gate; and a planarizing step of planarizing respective top) surfaces of the isolating insulating film, insulating layer, first floating gate and interlayer insulating film to expose the top surface of the first floating gate.

BRIEF DESCRIPTION OF THE DRAWINGS

The above and other objects, advantages and features of the present invention will be more apparent from the following description taken in conjunction with the accompanying drawings, in which.

BRIEF DESCRIPTION OF THE PREFERRED EMBODIMENTS

A semiconductor device, nonvolatile semiconductor storage apparatus using the device and manufacture method according to one embodiment of the present invention will be described with reference to the drawings. It is understood that the invention is not limited to this embodiment, which is provided as only one example of an implementation of the invention. For example the invention is not restricted to EEPROMS, is applicable to other memories such as flash memories and memories in general where the memory cell isolation is a concern FIG. 4 is a plan view showing a main part of a memory array Of all EEPROM which is an example of a nonvolatile semiconductor storage apparatus that may advantageously use the present invention, FIG. 5 is an equivalent circuit of the memory array of FIG. 4, and FIG. 6 is a sectional view along line B—B of FIG. 4.

Figure 4:
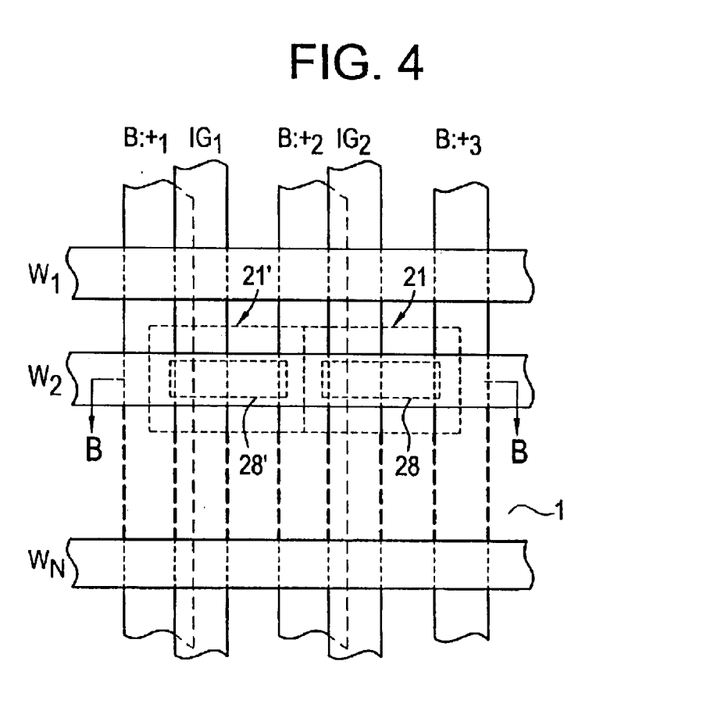
FIG. 4 illustrates a plan view showing a main part of a memory array of EEPROM according to one embodiment of the present invention.
Figure 5:
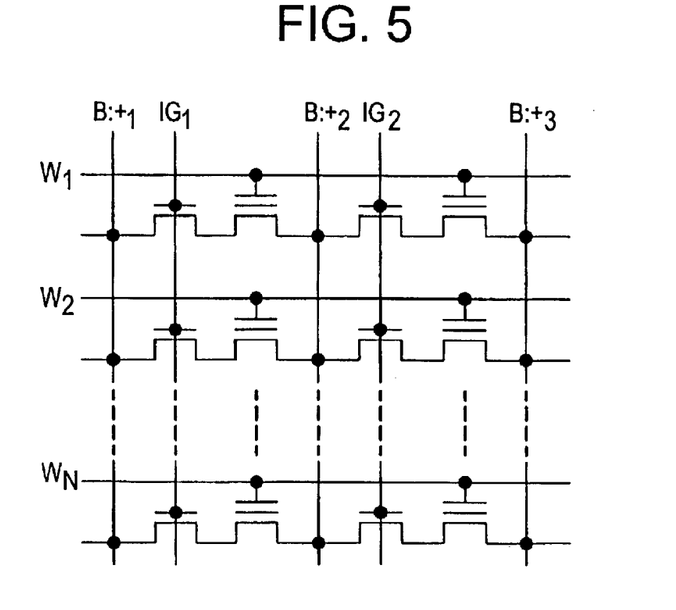
FIG. 5 illustrates an equivalent circuit diagram of the memory array of the EEPROM according to one embodiment of the present invention.
Figure 6:
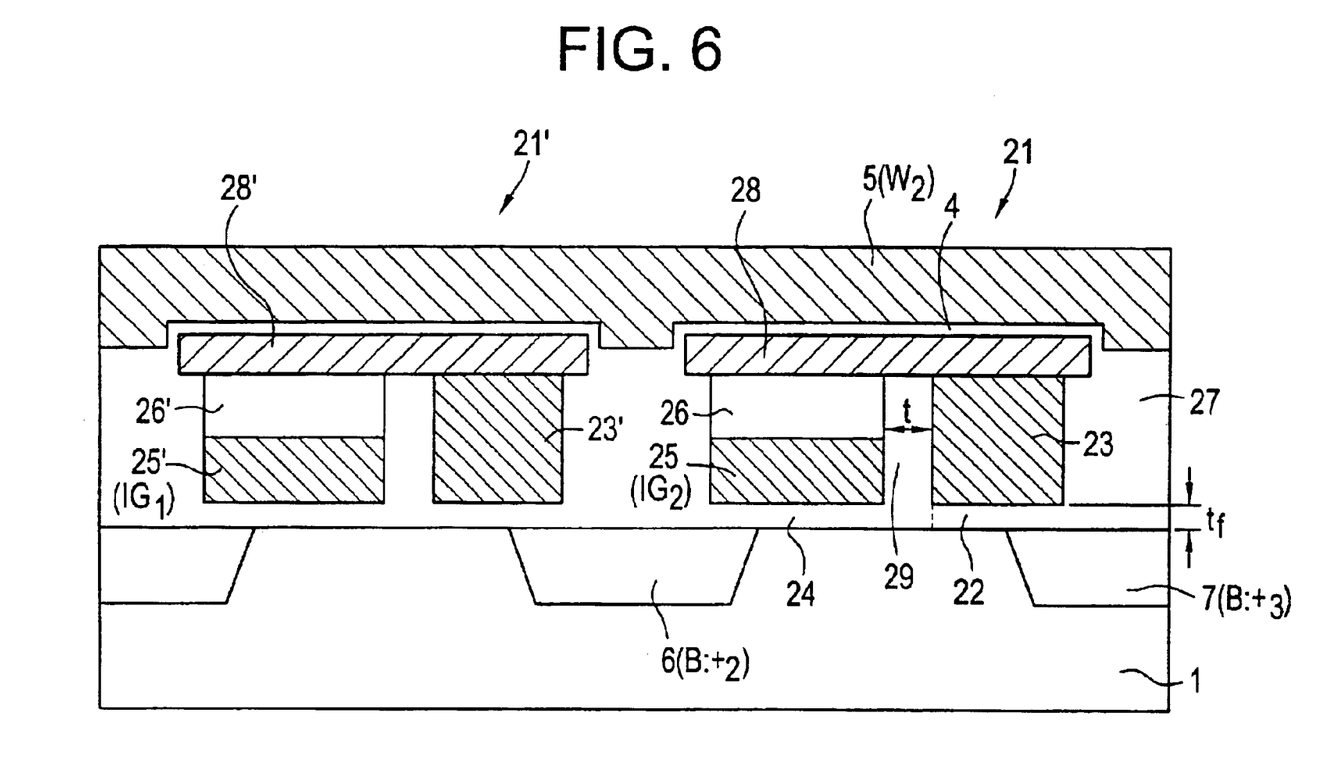
FIG. 6 illustrates a sectional view along line B—B of FIG. 4.

Referring to FIGS. 4–6, the main surface of a memory array area of a p-type silicon substrate (semiconductor substrate) 1 is provided with a buried bit line B ($+_1$, $+_2$, $+_3$, . . . ) consisting of an $n^+$-type semiconductor area. An isolating gate line IG ($IG_1$, $IG_2$, . . . ) parallel to the buried bit line B ($+_1$, $+_2$, $+_3$, . . . ) is formed on the semiconductor substrate 1, a word line W ($W_1$, $W_2$, . . . ) is disposed on the semiconductor substrate 1 in a direction crossing at right angles to the buried bit line B ($+_1$, $+_2$, $+_3$, . . . ) and isolating gate line IG ($IG_1$, $IG_2$, . . . ), and a memory cell for storing one bit of information is formed in an area in which the word line W intersects a buried bit line B and an isolating gate line IG.

For example, a memory cell 21 belongs to the second bit line B (B:$+_2$).

In the memory cell 21, on the main surface of the p-type silicon substrate 1, a first floating gate 23 is formed via a tunnel oxide film (silicon oxide film) 22 (first gate insulating film), and an isolating gate 25 is formed via an isolating gate oxide film (silicon oxide film) 24. An isolating insulating film 26 which may be of a silicon nitride film is formed on the isolating gate 25.

The first floating gate 23 is formed next to the isolating gate 25 and separated therefrom by an insulating film 29.

Side surfaces of the first floating gate 23, isolating gate 25 and isolating insulating film 26 are covered with an interlayer oxide film (interlayer insulating film) 27. A second floating gate 28 is formed on the first floating gate 23 and on isolating insulating film 26 to cover them. It is understood that the invention also includes, for example, the first floating gate formed integrally with the second floating gate as a unitary structure.

A control gate 5 is formed on the second floating gate 28 via a second gate insulating film 4.

A source area 6 and drain area 7 consisting of an $n^+$-type semiconductor integrated with a buried bit line B ($+_1$,$+_2$, $+_3$, . . . ) are formed in the p-type semiconductor substrate 1 on respective sides of the first floating gate 23 and isolating gate 25. This source area 6 serves as the drain area of the adjacent memory cell 21', and the drain area 7 serves as the source area of the adjacent memory cell (not shown) which belongs to the bit line B (B:+3).

Moreover, formed between the first floating gate 23 and the isolating gate 25 is the insulating film 29 which may be of silicon oxide thicker than the tunnel oxide film 22.

The tunnel oxide film 22 may be thick to such an extent that the electron can pass through by the tunnel effect during channel Fowler-Nordheim (FN) electron injection/extraction performed to write/erase data.

Moreover, the thickness t of the insulating film 29 is preferably larger than thickness $t_f$ of the tunnel oxide film 22, more preferably twice as large as the thickness when both films are of silicon oxide.

Even during the channel Fowler-Nordheim (FN) electron injection/extraction, there is no possibility that the electron passes through the insulating film 29 by the tunnel effect.

Figure 7:
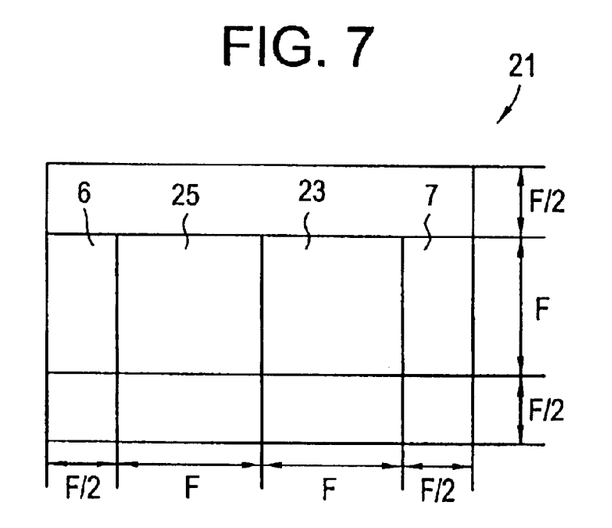
FIG. 7 illustrates an explanatory view of a minimum design area of a memory cell of the present invention.

For the memory cell 21, when a minimum design dimension that is for exposure and etching steps is F as shown in FIG. 7, each length of the isolating gate 25 and first floating gate 23 in a direction of word line W is F. Each first floating gate 23 is able to be made shorter length, but it is practically made length F because of its reliability. Each length of the common source area 6 and drain area 7 is F/2 except for the overlapped length for the common source area 6 and the isolating gate 25 and the overlapped length for the common drain area 7 and the first floating gate 23, because the F/2 is a half of the distance F between the isolating gate 25 of the memory cell 21 and the first floating gate 23' of the memory cell 21'. A width of the common source area 6 and drain area 7 in a direction of bit line B is F. A distance from a boundary line with the adjacent memory cell is F/2, then a minimum design area per memory cell is $6F^2$.

Figure 8:
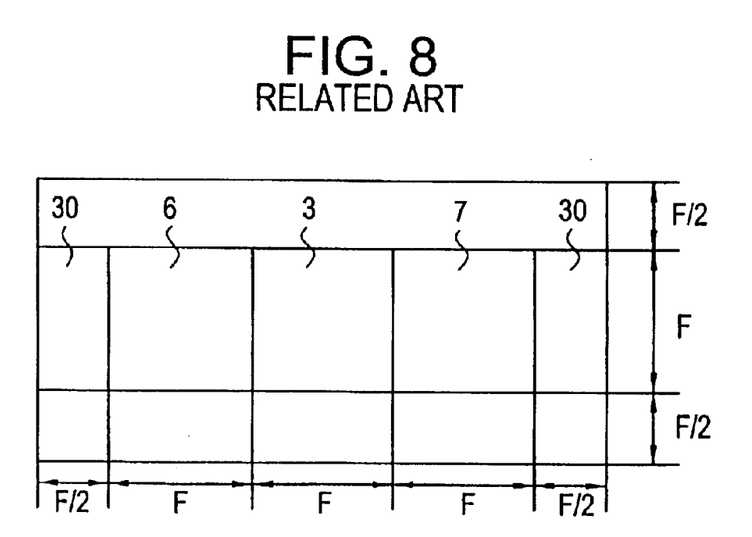
FIG. 8 illustrates an explanatory view of the minimum design area of a conventional memory cell.

On the other hand, for the conventional memory cell, as shown in FIG. 8, each length of the floating gate 3, source area 6 and drain area 7 in the direction of the word line W is F, the distance from the boundary line with the adjacent memory cell of an isolation band 30 is F/2, the width in the direction of the bit line B is F, and the distance from the boundary line with the adjacent memory cell is F/2, then the minimum design area per memory cell turns to be $8F^2$.

Therefore, the minimum design area $6F^2$ of the memory cell 21 at a memory cell according to the invention is ¾ of the minimum design area $8F^2$ of the conventional memory cell.

A method of manufacturing the memory cell 21 will next be described with reference to FIGS. 9A to 9L. Other manufacturing methods may be used and the invention is not limited to the manufacturing method described herein.

Figure 9A:
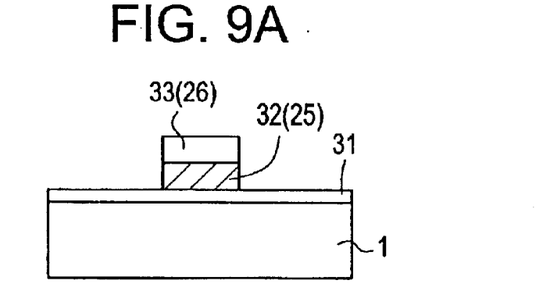
FIG. 9A illustrates a process diagram showing a manufacture method of the memory cell of the present invention.

First, as shown in FIG. 9A, the surface of the p-type silicon substrate 1 is oxidized, and a silicon oxide film 31 with a thickness of 10 to 20 nm is formed to constitute the tunnel oxide film 22 and isolating gate oxide film 24.

Subsequently, on the silicon oxide film 31, a polysilicon film 32 with a thickness of 100 to 200 nm is deposited by a low-pressure chemical vapor deposition (LPCVD) method, and P (phosphorous) or other n-type impurities are doped to provide a concentration of about $1 \times 10^{20}$ cm$^{-3}$.

Additionally, the doping may be performed while the polysilicon film 32 is deposited, or may be performed by a diffusion method or an ion injection method.

Subsequently, on the n-type polysilicon film 32, a silicon nitride film 33 with a thickness of 20 to 30 nm is deposited by the LPCVD method, and the laminated film is patterned to form the isolating gate 25 and isolating insulating film 26.

Figure 9B:
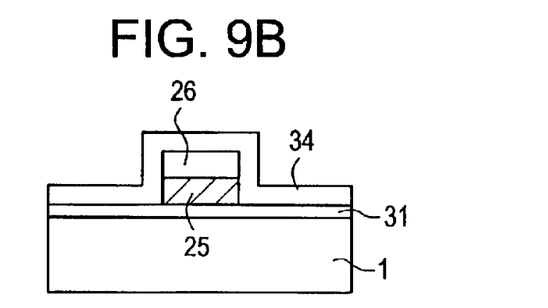
FIG. 9B illustrates a process diagram showing a manufacture method of the memory cell of the present invention.
Figure 9C:
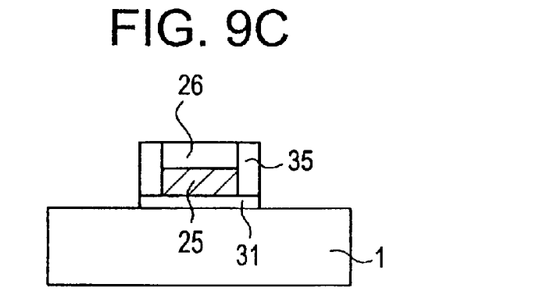
FIG. 9C illustrates a process diagram showing a manufacture method of the memory cell of the present invention.

Subsequently, as shown in FIG. 9B, a silicon oxide film 34 with a thickness of 10 to 30 nm is deposited by the LPCVD method, and as shown in FIG. 9C, the silicon oxide film 34 is etched back by anisotropic etching to form a side wall 35 consisting of the silicon oxide film on both sides of the isolating gate 25 and isolating insulating film 26. In this case, the silicon oxide film 31 is removed excluding a portion positioned under the isolating gate 25 and side wall 35.

Additionally, for the side wall 35, instead of depositing the silicon oxide film 34, n-type polysilicon as a main component of the isolating gate 25 is subjected to thermal oxidation, the silicon oxide film of about 10 nm is formed on both sides of the isolating gate 25, and both sides of silicon nitride as the main component of the isolating insulating film 26 may be modified.

Figure 9D:
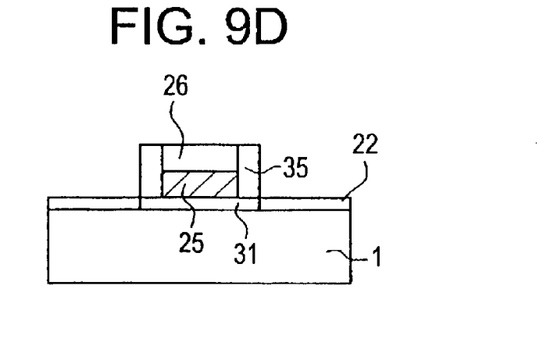
FIG. 9D illustrates a process diagram showing a manufacture method of the memory cell of the present invention.

Subsequently, as shown in FIG. 9D, thermal oxidation is performed, and the tunnel oxide film 22 with a thickness of about 8 to 10 nm is formed on an exposed surface of the p-type silicon substrate 1, that is, the exposed surface outside the side wall 35.

Figure 9E:
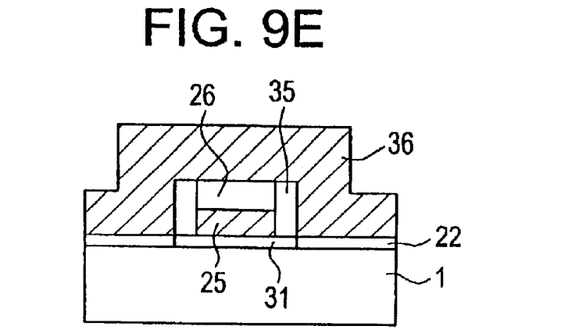
FIG. 9E illustrates a process diagram showing a manufacture method of the memory cell of the present invention.

Subsequently, as shown in FIG. 9E, a polysilicon film 36 with a thickness of 200 to 300 nm is deposited by the LPCVD method, and P or other n-type impurities are doped to provide a concentration of about $1 \times 10^{19}$ to $1 \times 10^{20}$ cm$^{-3}$. Additionally, the doping may be performed while the polysilicon film 36 is deposited, or may be performed by the diffusion method or the ion injection method.

Figure 9F:
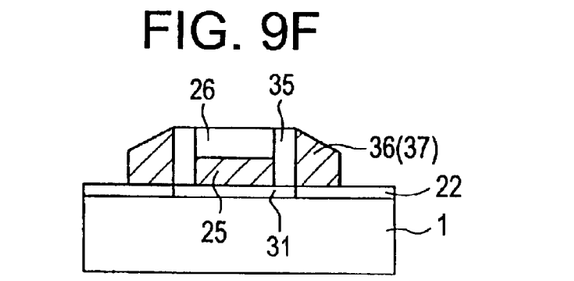
FIG. 9F illustrates a process diagram showing a manufacture method of the memory cell of the present invention.

Subsequently, as shown in FIG. 9F, the polysilicon film 36 is etched back by the anisotropic etching to form a polysilicon side wall 37 outside the side wall 35.

Figure 9G:
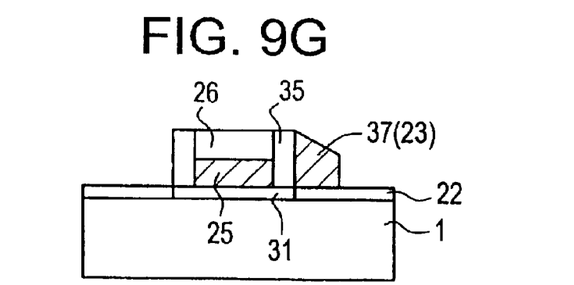
FIG. 9G illustrates a process diagram showing a manufacture method of the memory cell of the present invention.
Figure 10:
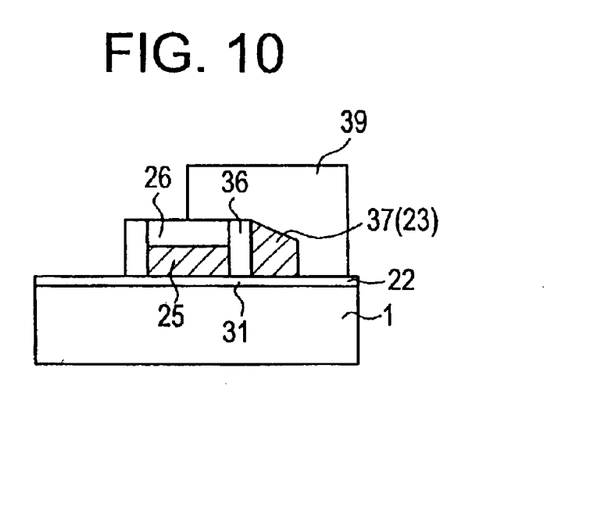
FIG. 10 illustrates a process diagram showing a manufacture method after FIG. 9F of the memory cell of the present invention.

Subsequently, as shown in FIG. 9G, by removing the polysilicon side wall 37 on a source side using a etching mask 39 showed in FIG. 10, the polysilicon side wall 37 on a drain side is formed into the first floating gate 23.

Additionally, in a memory array to which the memory cell 21 is applied, the polysilicon side wall 37 is fixed to either one of the source side and drain side as for all the memory cells.

Figure 9H:
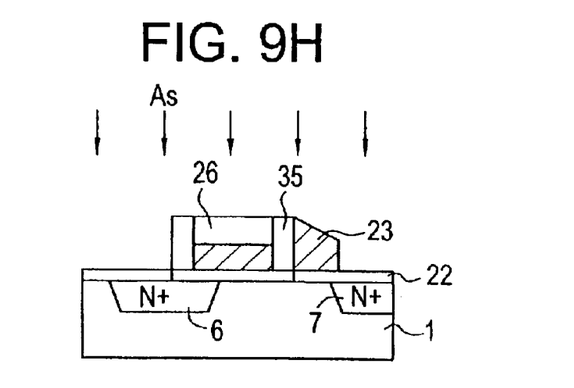
FIG. 9H illustrates a process diagram showing a manufacture method of the memory cell of the present invention.
Figure 9I:
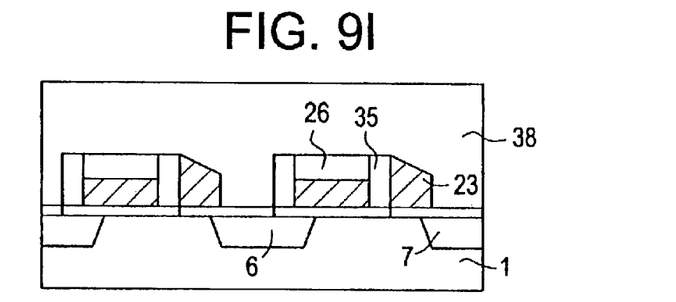
FIG. 9I illustrates a process diagram showing a manufacture method of the memory cell of the present invention.

Subsequently, as shown in FIG. 9H, the isolating insulating film 26, side wall 35 and first floating gate 23 are used as a mask, As (arsenic) or other n-type impurities are doped in an area for forming the source and drain of the p-type semiconductor substrate 1 to provide a concentration of about $1 \times 10^{20}$ cm$^{-3}$, and the source area 6 and drain area 7 consisting of the n$^+$-type semiconductor are formed. The source area 6 and drain area 7 are integrated with the buried bit line B ($+_1$, $+_2$, $+_3$, ... ) Subsequently, as shown in FIG. 9I, by the LPCVD method or a high density plasma (HDP) CVD method, a silicon oxide film 38 with a thickness of 500 nm to 1 μm is deposited to constitute an interlayer oxide film.

Figure 9J:
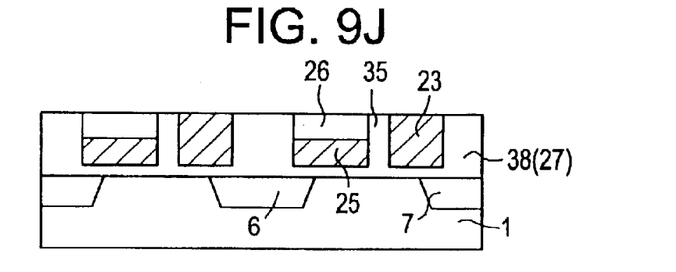
FIG. 9J illustrates a process diagram showing a manufacture method of the memory cell of the present invention.

Subsequently, as shown in FIG. 9J, the isolating insulating film 26 is used as a stopper in a CMP (chemical-mechanical polishing) method to polish and planarize the silicon oxide film 38, so that the Lop surface of the first floating gate 23 is exposed. The planarized silicon oxide film 38 serves as the interlayer oxide film 27.

In this case, a polishing depth is adjusted in such a manner that the thickness of the planarized isolating insulating film 26 is secured in a range of about 10 to 15 nm.

Figure 9K:
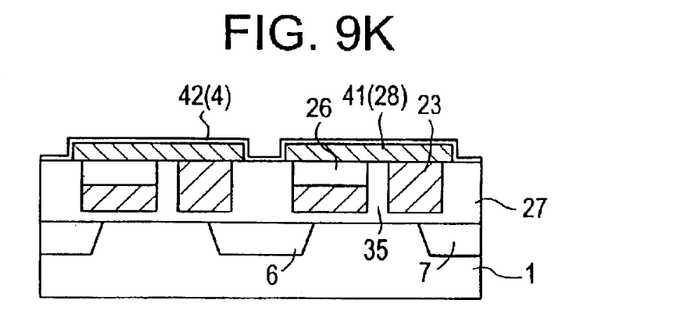
FIG. 9K illustrates a process diagram showing a manufacture method of the memory cell of the present invention.

Subsequently, as shown in FIG. 9K, on the planarized surface, a polysilicon film 41 with a thickness of 50 to 200 nm is deposited by the LPCVD method, and P or other n-type impurities are doped to provide a concentration of about $1 \times 10^{20}$ cm$^{-3}$. Additionally, the doping may be performed while the polysilicon film 41 is deposited, or may be performed by the diffusion method or the ion injection method.

The polysilicon film 41 is patterned, and the second floating gate 28 is formed to cover the first floating gate 23 and isolating insulating film 26.

Subsequently, on the gate, an interpolymer film 42 with an oxide film reduced thickness of 10 to 25 nm is deposited by the LPCVD method to form the second gate insulating film 4. As the interpolymer film 42, for example, a lamination structure is preferable which comprises three layers of a 4 to 10 nm thick silicon oxide film, 4 to 10 nm thick silicon nitride film, and 4 to 10 nm thick silicon oxide film.

Figure 9L:
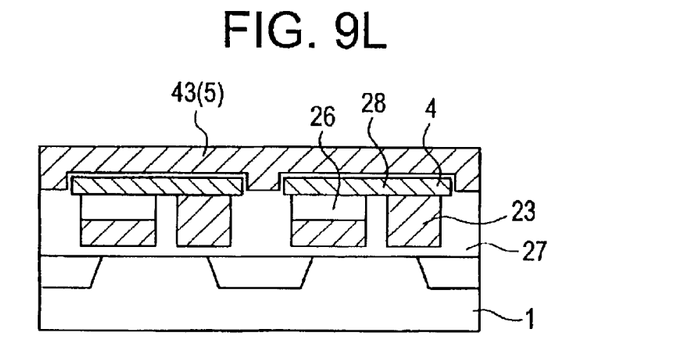
FIG. 9L illustrates a process diagram showing a manufacture method of the memory cell of the present invention.

Subsequently, as shown in FIG. 9L, on the second gate insulating film 4, by the LPCVD method a 10 to 20 nm thick polysilicon oxide film and a 10 to 20 nm silicide film are successively grown to form a polycide film 43.

Subsequently, the polycide film 43 is patterned to form the control gate 5.

During the patterning, not only the polycide film 43 which is to be the control gate 5, but also the interpolymer film 42, second floating gate 28, and first floating gale 23 are successively etched, and the first floating gate 23 and second floating gate 28 are divided in a direction along the bit line 1 (direction perpendicular to a sheet surface of FIG. 9). In this case, for the isolating gate 25, the isolating insulating film 26 serves as a stopper, and the isolating gate 25 is continuously structured in the direction along the bit line B.

As described above, the memory cell 21 is formed on the p-type silicon substrate 1.

Figure 11:
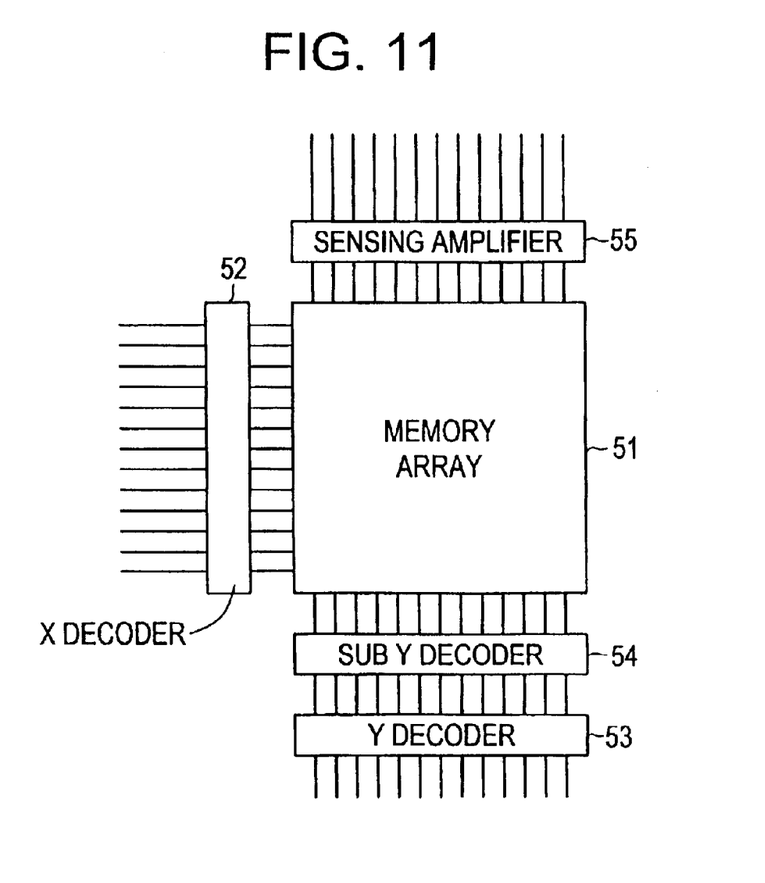
FIG. 11 illustrates a block diagram showing a semiconductor memory according to one embodiment of the present invention.

FIG. 11 is a block diagram showing a semiconductor memory of the present embodiment, and in the drawing, numeral 51 denotes a memory array which comprises memory cells 21 arranged in matrix. Numeral 52 denotes an X decoder for inputting an address signal into the memory array 51 in order to select one word line W ($W_1, W_2, \ldots$) on writing, reading, and erasing data in the memory cell. Numeral 53 denotes a Y decoder for inputting an address signal into the memory array 51 in order to select one buried bit line B ($+_1, +_2, +_3, \ldots$) on writing and reading data in the memory cell. Numeral 54 denotes a sub Y decoder (selecting means), disposed between the memory array 51 and the Y decoder 53, for driving one isolating gate line IG to select an odd-numbered bit line or an even-numbered bit line.

Numeral 55 denotes a sensing amplifier for amplifying data outputted from the memory array 51.

An operation of the semiconductor memory will next be described.

(1) Writing

TABLE 1

| | | Writing | | | | | | |
|---|---|---|---|---|---|---|---|---|
| | Word voltage | | Drain voltage | | Source voltage | | Isolating gate voltage | |
| | Select | Non-select | Select (write) | Non-select (non-write) | Select | Non-select | Select | Non-select |
| Operation voltage (V) | 19 | 0 | 0 | 5 | Open | Open | 0 | 0 |

After erasing the information of all memory cells connected to a word, writing is performed by a word unit in parallel by channel FN electron injection.

For example, when writing is performed on the memory cell belonging to an n-th bit line (B: $+_n$), all isolating gates are turned OFF, and a bit line (B: $+_{n+1}$) corresponding to the drain is selected. Moreover, with writing of data '1' the bit line (B: $+n+_{n+1}$) is grounded (0 V is applied), and with writing of data '0' a writing inhibition voltage of about 5 V is applied to the bit line (B: $+_{n+1}$). Thereafter, a high voltage of about 19 V is applied to the word line W to perform the writing.

In this case, since an isolated transistor has the isolating gate OFF, the voltage supplied to the bit line (B: $+_n$) fails to participate in the writing to the memory cell which belongs to the n-th bit line (B: $+_n$). That is called Open state of the source of the memory cell which belong to the n-th bit line (B: $+_n$).

Additionally, in Table 1, the bit line for writing the data '1' is represented as select (write), and the bit line for writing the data '0' is represented as non-select (non-write).

(2) Erasing

TABLE 2

| | | Erasing | | | | | | |
|---|---|---|---|---|---|---|---|---|
| | Word voltage | | Drain voltage | | Source voltage | | Isolating gate voltage | |
| | Select | Non-select | Select (write) | Non-select (non-write) | Select | Non-select | Select | Non-select |
| Operation voltage (V) | −16 | 0 | Open | Open | Open | Open | 0 | 0 |

Erasing is performed by channel FN electron extraction and by a word unit.

All the isolated transistors have their isolating gates IG turned OFF, and all the bit lines B is Open. In this case, all the drains of all the memory cells are Open. Since all the isolated transistor having their isolating gates IG OFF, the voltage supplied to the bit line (B: $+_n$) fails to participate in the erasing to the memory cell which belongs to the n-th bit line (B: $+_n$). That is called Open state of the source of the memory cell which belongs to the n-th bit line (B: $+_n$). After that, the erasing is performed by applying a negative voltage of about −16 V to the word line W.

(3) Reading

TABLE 3

| | Reading | | | | | | | |
|---|---|---|---|---|---|---|---|---|
| | Word voltage | | Drain voltage | | Source voltage | | Isolating gate voltage | |
| | Select | Non-select | Select (write) | Non-select (non-write) | Select | Non-select | Select | Non select |
| Operation voltage (V) | 0–5 | 0 | 1 | Open | 0 | Open | 3.3 | 0 |

For example, in a case in which data is read from the memory cell to which the even-numbered bit line (B: $+_{2n}$) belongs, an isolating gate line $IG_{2n}$ is turned ON, an isolating gate line $IG_{2n-1}$ is turned OFF, the bit line (B: $+_{2n}$) is selected as the source, and a bit line (B: $+_{2n+1}$) is selected as the drain.

Subsequently, the bit line (B: $+_{2n}$) of the memory cell is grounded (0 V), a voltage of 1 V is applied to the bit line (B: $+_{2n+1}$), a voltage of 3.3 V is applied to the isolating gate line $IG_{2n}$, and a voltage between 0 V and 5 V is applied to the word line $W_2$ (control gate 5).

Moreover, in a case in which data is read from the memory cell to which the odd-numbered bit line (B: $+_{2n-1}$) belongs, the isolating gate line $IG_{2n}$ is turned OFF, the isolating gate line $IG_{2n-1}$ is turned ON, the bit line (B: $+_{2n-1}$) is selected as the source, and the bit line (B: $+_{2n}$) is selected as the drain.

Subsequently, the bit line (B: $+_{2n-1}$) of the memory cell is grounded (0 V), a voltage of 1 V is applied to the bit line (B: $+_{2n}$), a voltage of 3.3 V is applied to the isolating gate line $IG_{2n-1}$, and a voltage between 0 V and 5 V is applied to the word line $W_2$ (control gate 5).

As described above, according to the memory cell 21 of the present embodiment, since the isolating gate 25 and isolating insulating film 26 are formed parallel to the first floating gate 23, and the second floating gate 28 is formed on the first floating gate 23 and isolating insulating film 26 covers these, a large capacity ratio can be secured by forming the floating gate in the two-layer structure.

Since the interlayer oxide film 27 formed on the source area 6 and drain area 7 is constituted by the silicon oxide film 38, the thickness can sufficiently be increased, the pressure resistance can thus be enhanced, and the high voltage can be applied to the control gate 5.

Since the source area 6 of the memory cell 21 is shared with the drain area of the adjacent memory cell 21, and the drain area 7 is shared with the source area of the adjacent memory cell, by turning OFF the isolating gate 25 during data writing, the writing inhibition voltage can be applied to each bit of one word.

As described above, by using the memory cell 21 with a small area of $6F^2$ according to the present invention, a memory such as an EEPROM, flash memory and the like can be realized in which low power consumption, parallel writing, and high reliability can be secured and the channel FN writing/erasing is used.

One embodiment of the semiconductor device of the present invention, nonvolatile semiconductor storage apparatus using the device and manufacture method has been described above with reference to the drawings, but concrete constitution is not limited to the present embodiment, and design can be changed within the scope of the present invention.

For example, in the present embodiment the memory array inlay be of NOR type, but the type is not limited, and another type of memory array may also be used.

Moreover, the number, shape, and the like of the buried bit line B, isolating gate line IG, and word line W can appropriately be changed in accordance with required properties of the memory array.

As described above, according to the semiconductor device of the present invention, since the floating gate is of the two-layer structure which comprises the first floating gate and the second floating gate disposed to cover the first floating gate, the capacity ratio can be increased, and low voltage can be realized.

Moreover, since the isolating gate is formed parallel to the first floating gate via the isolating insulating film, the element isolation function during application of the high voltage can be enhanced, and as a result, the reliability can be enhanced.

As described above, there can be provided the semiconductor device with the small occupied area, low power consumption, and high reliability.

According to the nonvolatile semiconductor storage apparatus of the present invention, since the semiconductor device of the present invention is disposed on the respective intersections of the buried bit line and word line, the channel FN electron injection/extraction can be performed, and there can be provided the nonvolatile semiconductor storage apparatus with the small occupied area, low power consumption, parallel writing, and high reliability.

According to the manufacture method of the semiconductor device of the present invention, by using the conventional manufacture apparatus as it is, and only slightly changing the manufacture process, the semiconductor device can easily be prepared in which the isolating gate is formed on the second floating gate on the semiconductor substrate side and parallel to the first floating gate via the isolating insulating film.

It is apparent that the present invention is not limited to the above embodiments, but may be modified and changed without departing from the scope and spirit of the invention.

What is claimed is:

1. A nonvolatile semiconductor memory device comprising:

a plurality of bit lines arranged in a semiconductor substrate;

a plurality of word lines above said semiconductor substrate arranged to intersect the bit lines; and a plurality of said semiconductor devices which are disposed at respective intersections of said bit lines and said word lines, each of said semiconductor devices includes:

a first gate insulating film on a semiconductor substrate,
an isolating gate electrode on said first gate insulating film,
an isolating insulating film on the top surface of said isolating gate electrode and a side surface of said isolating gate electrode,
a floating gate on said isolating insulating film,
a second gate insulating film on said floating gate,
a control gate on said second gate insulating film; and
a source region and a drain region in said semiconductor substrate on opposite sides of said floating gate;
wherein said floating gate comprises a first floating gate portion which is on said first gate insulating film and is adjacent to said isolating gate electrode through a part of said isolating insulating film on said side surface of said isolating gate electrode and a second floating gate portion which is on said first floating gate portion and on a part of said isolating insulating film on said top surface of said isolating gate electrode,
wherein said plurality of bit lines includes said drain regions and said plurality of word lines includes said control gate,
further comprising:
an X decoder which selects one of said word lines,
a Y decoder which selects one of said buried bit lines; and
a sub Y decoder which selects one of said isolating gates,
wherein said X decoder supplies a first individual voltage to one of said word lines which a selected semiconductor device belongs to, said Y decoder supplies a second individual voltage to one of said buried bit lines which is adjacent to said selected semiconductor device, said sub Y decoder selects none of said isolating gates at a writing time.

2. The device as claimed in claim 1, wherein said bit lines are buried bit lines.

3. A nonvolatile semiconductor memory device comprising:
a plurality of bit lines arranged in a semiconductor substrate;
a plurality of word lines on said semiconductor substrate arranged to intersect the bit lines; and
a plurality of said semiconductor devices which are disposed at respective intersections of said bit lines and said word lines, each of said semiconductor devices includes:
a first gate insulating film on a semiconductor substrate,
an isolating gate electrode on said first gate insulating film,
an isolating insulating film on the top surface of said isolating gate electrode and a side surface of said isolating gate electrode,
a floating gate on said isolating insulating film,
a second gate insulating film on said floating gate,
a control gate on said second gate insulating film; and
a source region and a drain region in said semiconductor substrate on opposite sides of said floating gate;
wherein said floating gate comprises a first floating gate portion which is on said first gate insulating film and is adjacent to said isolating gate electrode through a part of said isolating insulating film on said side surface of said isolating gate electrode and a second floating gate portion which is on said first floating gate portion and on a part of said isolating insulating film on said top surface of said isolating gate electrode,
wherein said plurality of bit lines includes said drain regions and said plurality of word lines includes said control gate,
further comprising:
an X decoder which selects one of said word lines,
a Y decoder which selects one of said bit lines; and
a sub Y decoder which selects one of said isolating gates,
wherein said X decoder supplies-a first individual voltage to one of said word lines which a selected semiconductor device belongs to, said Y decoder supplies a second individual voltage to none of said buried bit lines, said sub Y decoder selects none of said isolating gates at a erasing time.

4. The device as claimed in claim 3, wherein said bit lines are buried bit lines.

5. A semiconductor device comprising a memory cell, said memory cell comprising:
an isolating transistor comprising an isolating gate formed over a semiconductor substrate with an intervention of a first isolating insulating film therebetween and having first and second sides that define a width of said isolating gate; and
a memory cell transistor comprising:
a floating gate formed over said semiconductor substrate with an intervention of a first gate insulating film therebetween and arranged to face said first side of said isolating gate, said floating gate being extended over said isolating gate toward said second side of said isolating gate with an intervention of a second isolating insulating film to thereby form an extended area that covers said isolating gate; and
a control gate formed to cross over said floating gate and said extended area thereof with an intervention of a second gate insulating film,
wherein said memory cell operates in a writing mode, a reading mode and an erasing mode, and
wherein said isolating transistor turns off in said writing mode and said erasing mode of said memory cell, and said isolating transistor turns on in said reading mode of said memory cell.

6. The device as claimed in claim 5, wherein said extended area of said floating gate is terminated beyond said second side of said isolating gate.

7. The device as claimed in claim 6, wherein said semiconductor substrate includes source and drain regions selectively formed therein to define a channel portion therebetween, said floating gate and said isolating gate being formed over said channel portion of said semiconductor substrate.

8. The device as claimed in claim 7, wherein said control gate further crosses over at least one of said source and drain regions with an intervention of an insulating layer that is larger in thickness than said first gate insulating film.

9. The device as claimed in claim 6, wherein said floating gate is formed to face said first side of said isolating gate at a distance that is larger than a thickness of said first gate insulating film.

10. The device as claimed in claim 9, wherein said first gate insulating film is smaller in thickness than said first isolating insulating film.

11. A semiconductor device comprising:
a semiconductor substrate having a first bit line, a second bit line and a third bit line arranged thereon in a first direction, to define a first channel region between said first bit line and said second bit line and a second channel region between said second bit line and said third bit line;

a first memory cell formed on said semiconductor substrate including:
  a first isolating transistor having:
    said first bit line; and
    a first isolating gate sandwiched between said first bit line and said second bit line and positioned over a first portion of said first channel region, said first portion being adjacent to said first bit line; and
  a first memory cell transistor having:
    said second bit line;
    a first floating gate sandwiched between said first isolating gate and said second bit line and positioned over a second portion of said first channel region, said second portion being adjacent to said second bit line, and said first floating gate extending over said first isolating gate; and
    a first control gate over said first floating gate; and
a second memory cell formed on said semiconductor substrate including:
  a second isolating transistor having:
    said second bit line; and
    a second isolating gate sandwiched between said second bit line and said third bit line and positioned over a first portion of said second channel region, said first portion being adjacent to said second bit line; and
  a second cell transistor having:
    said third bit line;
    a second floating gate sandwiched between said second isolating gate and said third bit line and positioned over a second portion of said second channel region, said second portion being adjacent to said third bit line, said second floating gate extending over said second isolating gate; and
    a second control gate over said second floating gate, said second control gate being connected to said first control gate,
wherein said first memory cell operates in a writing mode, a reading mode and an erasing mode, and
wherein said first isolating transistor turns off in said writing mode and said erasing mode of said first memory cell, and said first isolating transistor turns on in said reading mode of said first memory cell.

12. The device as claimed in claim 11,
wherein said first channel region under said first isolating gate is open state in said writing mode and said erasing mode of said first memory cell.

13. The semiconductor device as claimed in claim 12,
wherein said first bit line performs as a source region of said first memory cell and said second bit line performs as a drain region of said first memory cell in said reading mode of said first memory cell.

14. The semiconductor device as claimed in claim 13,
wherein said second bit line performs as a source region of said second memory cell and said third bit line performs as a drain region of said second memory cell in said reading mode of said second memory cell.

* * * * *

UNITED STATES PATENT AND TRADEMARK OFFICE
CERTIFICATE OF CORRECTION

PATENT NO. : 6,917,071 B2 Page 1 of 1
APPLICATION NO. : 10/347397
DATED : July 12, 2005
INVENTOR(S) : Fumihiko Hayashi It is certified that error appears in the above-identified patent and that said Letters Patent is hereby corrected as shown below:

On the Title Page (57)
Abstract, Line 1, delete "There are provided a" insert -- A --

On the Title Page (57)
Abstract, Line 5, after "device." begin a new paragraph

On the Title Page (57)
Abstract, Line 14, delete "26".

Col. 1, Line 7, delete "now abandoned".

Signed and Sealed this

Nineteenth Day of September, 2006

JON W. DUDAS
*Director of the United States Patent and Trademark Office*